(12) United States Patent
Gowda et al.

(10) Patent No.: US 9,570,376 B2
(45) Date of Patent: Feb. 14, 2017

(54) ELECTRICAL INTERCONNECT FOR AN INTEGRATED CIRCUIT PACKAGE AND METHOD OF MAKING SAME

(71) Applicant: General Electric Company, Schenectady, NY (US)

(72) Inventors: Arun Virupaksha Gowda, Rexford, NY (US); Paul Alan McConnelee, Albany, NY (US); Kevin Matthew Durocher, Waterford, NY (US); Scott Smith, Niskayuna, NY (US); Donald Paul Cunningham, Dallas, TX (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/625,744

(22) Filed: Feb. 19, 2015

(65) Prior Publication Data

US 2015/0171036 A1 Jun. 18, 2015

Related U.S. Application Data

(63) Continuation-in-part of application No. 14/181,105, filed on Feb. 14, 2014, now Pat. No. 9,299,647, which
(Continued)

(51) Int. Cl.
*H01L 23/48* (2006.01)
*H01L 23/498* (2006.01)
(Continued)

(52) U.S. Cl.
CPC ....... *H01L 23/481* (2013.01); *H01L 23/49827* (2013.01); *H01L 23/5389* (2013.01);
(Continued)

(58) Field of Classification Search
CPC .. H01L 51/56; H01L 51/5253; H01L 51/0072; H01L 51/5012; H01L 51/5072
(Continued)

(56) References Cited

U.S. PATENT DOCUMENTS 6,495,914 B1  12/2002  Sekine et al.
2004/0089957 A1  5/2004  Shizuno
(Continued)

FOREIGN PATENT DOCUMENTS

JP  2008244451 A  10/2008

OTHER PUBLICATIONS

Search Report and Written Opinion from EP Application No. 11171566.0, dated Apr. 8, 2013.
U.S. Appl. No. 15/082,501, filed Mar. 28, 2014, Paul Alan McConnelee, et al.
Unofficial English Translation of Japanese Office Action issued in connection with corresponding JP Application No. 2011135845 on Sep. 6, 2016.

*Primary Examiner* — Andy Huynh
(74) *Attorney, Agent, or Firm* — Ziolkowski Patent Solutions Group, SC; Jean K. Testa

(57) ABSTRACT

A chip package includes a first substrate having at least one circuit layer formed on a first surface thereof, a first die mounted on a second surface of the first substrate opposite from the first surface, and an interconnection assembly comprising upper and lower conductive layers provided on an insulating substrate, with the upper conductive layer of the interconnection assembly affixed to the second surface of the first substrate and electrically connected to the at least one circuit layer of the first substrate. A second substrate is positioned on a side of the first die opposite from the first substrate so as to position the die between the first and second substrates, the second substrate having at least one circuit layer formed on an outward facing first surface thereof that is electrically connected to at least one of the lower conductive layers of the interconnection assembly and the first die.

20 Claims, 9 Drawing Sheets

Related U.S. Application Data is a continuation of application No. 12/826,359, filed on Jun. 29, 2010, now Pat. No. 8,653,670.

(51) Int. Cl.
  *H01L 23/538* (2006.01)
  *H01L 23/00* (2006.01)

(52) U.S. Cl.
  CPC .............. *H01L 24/19* (2013.01); *H01L 24/82* (2013.01); *H01L 23/49833* (2013.01); *H01L 2224/04105* (2013.01); *H01L 2224/06181* (2013.01); *H01L 2224/2518* (2013.01); *H01L 2224/32225* (2013.01); *H01L 2224/92144* (2013.01); *H01L 2924/01029* (2013.01); *H01L 2924/12042* (2013.01)

(58) Field of Classification Search
  USPC ........................................................ 257/774
  See application file for complete search history.

(56) References Cited

U.S. PATENT DOCUMENTS

| | | |
|---|---|---|
| 2006/0091524 A1 | 5/2006 | Karashima et al. |
| 2006/0231939 A1 | 10/2006 | Kawabata et al. |
| 2008/0197478 A1 | 8/2008 | Yang |
| 2009/0051038 A1 | 2/2009 | Jobetto |
| 2010/0002406 A1* | 1/2010 | Hsu ................... H01L 23/49822 361/764 |
| 2010/0072588 A1 | 3/2010 | Yang |
| 2010/0078797 A1 | 4/2010 | McConnelee et al. |
| 2010/0108371 A1 | 5/2010 | Furutani et al. |
| 2010/0132994 A1 | 6/2010 | Fillion et al. |
| 2010/0133705 A1 | 6/2010 | Fillion et al. |
| 2011/0058348 A1* | 3/2011 | Sakai ..................... H01L 23/481 361/803 |
| 2014/0367808 A1* | 12/2014 | Kuratani ................ H04R 19/04 257/416 |

* cited by examiner

ELECTRICAL INTERCONNECT FOR AN INTEGRATED CIRCUIT PACKAGE AND METHOD OF MAKING SAME

CROSS-REFERENCE TO RELATED APPLICATION

The present application is a continuation-in-part of, and claims priority to, U.S. patent application Ser. No. 14/181,105, filed Feb. 14, 2014, which is a continuation of, and claims priority to, U.S. patent application Ser. No. 12/826,359, filed Jun. 29, 2010, now issued as U.S. Pat. No. 8,653,670, the disclosures of which are incorporated herein in their entirety.

BACKGROUND OF THE INVENTION

Embodiments of the invention relate generally to integrated circuit packages and, more particularly, to an apparatus and method of fabricating a pre-fabricated electrical interconnect for an integrated circuit package.

As integrated circuits become increasingly smaller and yield better operating performance, packaging technology for integrated circuit (IC) packaging has correspondingly evolved from leaded packaging to laminated-based ball grid array (BGA) packaging and eventually to chip scale packaging (CSP). Advancements in IC chip packaging technology are driven by ever-increasing needs for achieving better performance, greater miniaturization, and higher reliability. New packaging technology has to further provide for the possibilities of batch production for the purpose of large-scale manufacturing thereby allowing economy of scale.

A standard CSP manufacturing process typically begins with placement of one or more dies onto a top surface of a silicon IC substrate. A plurality of re-distribution layers are then deposited onto the IC substrate and the die(s) and are patterned to form a thin-film metal re-routing and interconnection system. The re-distribution layers are typically formed from a benzocyclobutene (BCB) or polyimide material, for example, and applied via a spin-on or lamination application process. The electrical connection between the laminate re-distribution layers and the die(s) form an input/output (I/O) system to and from the die(s).

Advancements in IC packaging requirements pose challenges to the existing embedded chip build-up process. That is, it is desired in many current embedded chip packages to have an I/O system that provides inputs and outputs to both sides of the final IC package. In order to achieve this doubled-sided I/O system, electrical interconnections to the die(s) must be routed around the die(s) to the top and bottom surfaces of the IC package.

Several different methods have been developed to form a double-sided I/O system. For example, multiple lamination or re-distribution layers may be applied to the IC substrate to achieve the desired I/O system. However, the process of applying re-distribution layers in a layer-by-layer fashion can lead to warpage in the rerouting and interconnection system, requiring the use of a molded epoxy stress balance layer or metal stiffener to maintain a flat or planer IC package.

Furthermore, due to the small size and complexity of IC packages, the process for fabricating IC packages is typically expensive and time consuming. Using additional re-distribution layers to create the desired double-sided I/O system increases the number of processing steps, further increasing the cost and complexity of the manufacturing process.

Accordingly, there is a need for a simplified method for fabricating a double-sided I/O system for IC packages. There is a further need for a method for integrating double-sided I/O systems in IC packages while maintaining the flatness of the IC package.

It would therefore be desirable to have an apparatus and method of fabricating a pre-fabricated electrical interconnect for an integrated circuit package.

BRIEF DESCRIPTION OF THE INVENTION

In accordance with one aspect of the invention, a chip package includes a first substrate having at least one circuit layer formed on a first surface thereof, a first die mounted on a second surface of the first substrate opposite from the first surface, an interconnection assembly comprising upper and lower conductive layers provided on an insulating substrate, with the upper conductive layer of the interconnection assembly being affixed to the second surface of the first substrate and electrically connected to the at least one circuit layer of the first substrate, and a second substrate positioned on a side of the first die opposite from the first substrate so as to position the die between the first and second substrates, the second substrate having at least one circuit layer formed on an outward facing first surface thereof that is electrically connected to at least one of the lower conductive layers of the interconnection assembly and the first die.

In accordance with another aspect of the invention, an embedded chip package includes an interconnection assembly having an upper conductive layer, a lower conductive layer, and an insulating substrate positioned between the upper and lower conductive layers, the upper and lower conductive layers being electrically connected via metalized connections therebetween. The embedded chip package also includes a first substrate attached to the upper conductive layer and having at least one circuit layer formed thereon that is electrically connected to the upper conductive layer, a second substrate attached to the lower conductive layer and having at least one circuit layer formed thereon that is electrically connected to the lower conductive layer, and a first die mounted on the first substrate so as to be positioned between the first and second substrates and within an opening defined by the interconnection assembly.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
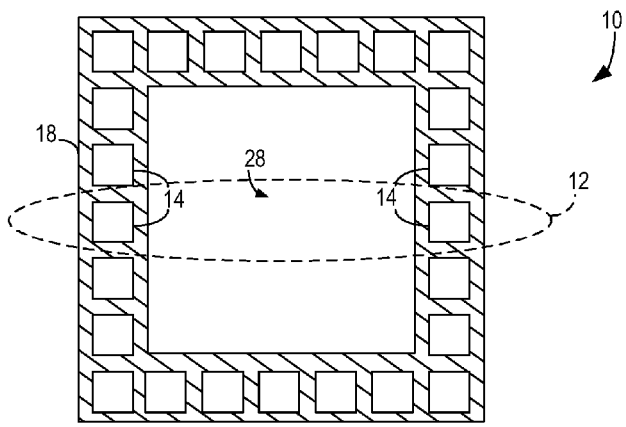
FIG. 1 is a top view of a feed through interconnect according to an embodiment of the invention.
Figure 2:
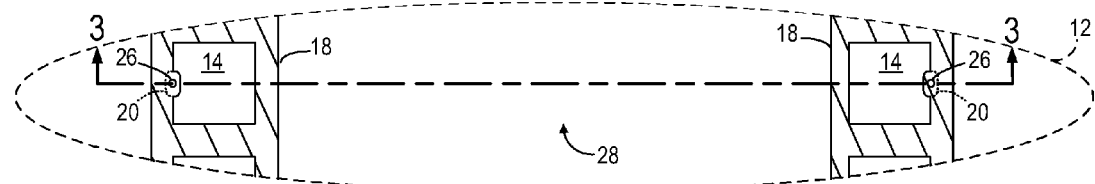
FIG. 2 is an enlarged view of a portion of the feed through interconnect of FIG. 1.
Figure 3:
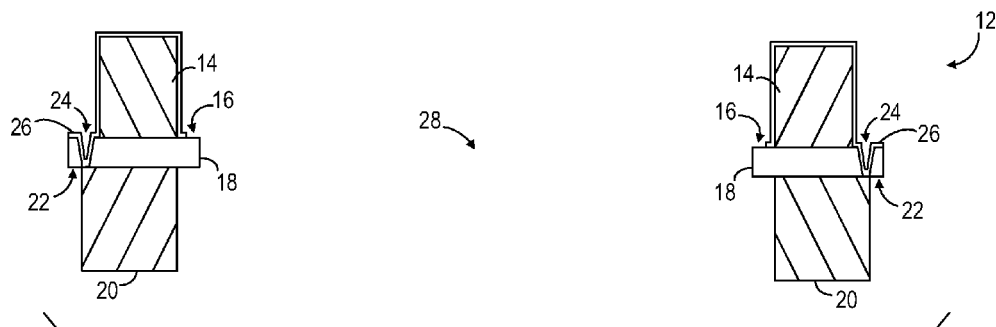
FIG. 3 is a sectional view of the portion of the feed through interconnect illustrated in FIG. 2.

FIG. 1 is a top view of an interconnect assembly or interposer 10 according to an embodiment of the invention. An enlarged view of a portion 12 of interposer 10 is provided in FIG. 2 to illustrate details of interposer 12. FIG. 3 is a sectional view of interposer 12 along line 3-3 of FIG. 2. As shown in FIGS. 1-3, interposer 10 includes a number of copper feed through pads 14 coupled to an upper surface 16 of a dielectric or insulating film layer 18, for example a polyimide material such as Kapton. A number of copper feed through pads 20 are coupled to a lower surface 22 of film 18. As shown in FIGS. 2-3, each upper feed through pad 14 has a corresponding lower feed through pad 20 aligned therewith. One skilled in the art will recognize that the number, shape, and pattern of feed through pads 14, 20 may be varied according to a given design specification.

Vias 24 are formed through film layer 18 and extend between top and bottom surfaces 16, 22 of film 18. Metallization paths 26 are formed on top surface 16 of film 18 and extend through vias 24 such that upper feed through pads 14 are electrically coupled to respective lower feed through pads 20. In one embodiment, metallization paths 26 may be formed using a sputtering and plating technique, followed by a lithography process. While FIG. 2 illustrates a single via 24 and corresponding metallization path 26 per pad 14, a second via and metallization path (not shown) may be included in high current applications, for example. Also, an opening 28 may be formed in a center portion of film 18 to accommodate one or more dies (not shown) when interposer 10 is integrated into an IC package, as described in more detail with respect to FIGS. 5-12, below.

Figure 4:
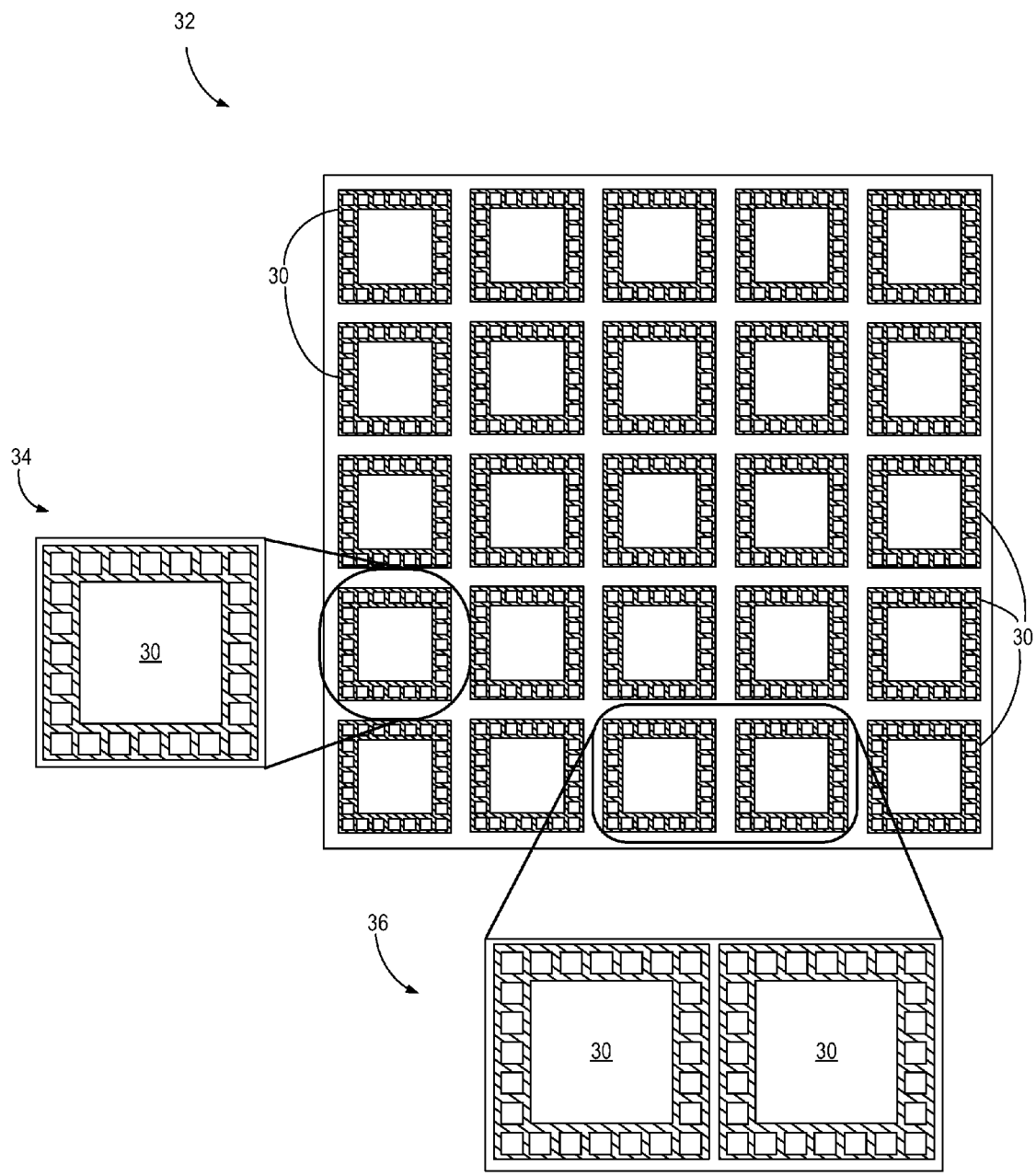
FIG. 4 is a top view of a panel of feed through interconnects according to an embodiment of the invention.

Referring now to FIG. 4, a plurality of feed through interconnects 30, similar to interconnect 10 of FIGS. 1-3 may be fabricated as a panel of interposers 32, according to one embodiment, to increase production speed and reduce manufacturing costs. After panel 32 is processed, individual interconnect modules 34 and/or multiple interconnect modules 36 are laser singulated from panel 32. Modules 34, 36 may be placed on a flex circuit with an embedded die, as described with respect to FIGS. 13-17.

Figure 5:
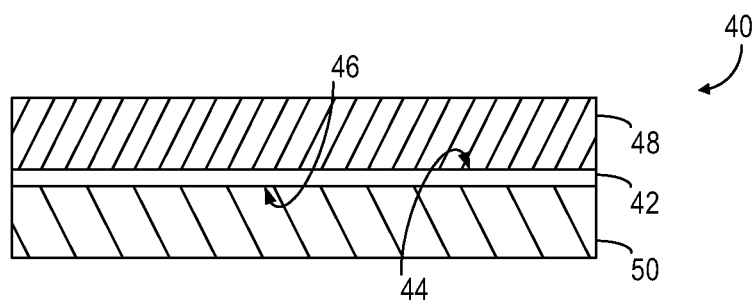
FIGS. 5-12 are schematic diagrams showing steps of making a feed through interconnect in accordance with an embodiment of the invention.
Figure 6:
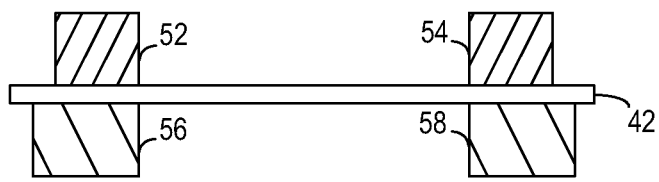

Referring to FIGS. 5-12, a technique for fabricating an interposer or interconnect assembly 38 is set forth, according to an embodiment of the invention. Fabrication of interconnect 38 begins with a sheet of pre-metalized flex 40 that comprises an insulating film material 42, for example a polyimide film such as Kapton. As shown in FIG. 5, top and bottom surfaces 44, 46 of film 42 are plated with respective layers 48, 50 of roll-annealed copper. The thickness of copper layers 48, 50 may be selected depending on design requirements, such as, for example, die thickness. Copper layers 48, 50 are patterned and etched to define a number of upper feed through pads 52, 54 on top surface 44 and lower feed through pads 56, 58 on bottom surface 46, as shown in FIG. 6. The pattern of feed through pads 52-58 may be laid out for a single module or multiple modules, as illustrated in FIG. 4.

According to one embodiment, film 42 is approximately 55 microns thick, and copper layers 48, 50 are each approximately 110 microns thick. However, the dimensions of flex layer 40 may be different based on design specifications. For example, as described in more detail below, the thickness of copper layers 48, 50 may be selected to be approximately equal to or greater than the thickness of a corresponding die. Further, the length and width of the sheet of pre-metalized flex 40 may be selected based on a given processing method and available processing tools.

Figure 7:
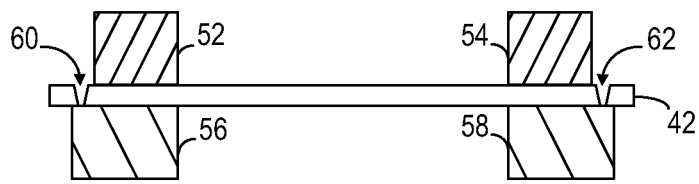
Figure 8:
Figure 9:
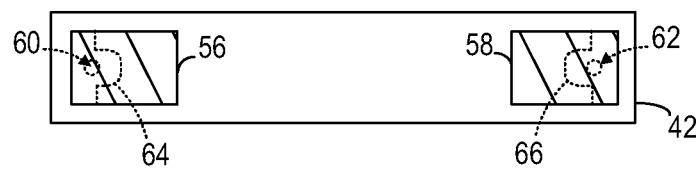

Referring to FIG. 7, vias 60, 62 are formed adjacent to recessed portions 64, 66, and extend through film layer 42. Vias 60, 62 may be formed by UV laser drilling or etching. According to various embodiments, one or more vias 60, 62 may be formed between each pair of lower and upper pads 52-58. FIGS. 8 and 9 illustrate respective top and bottom views of a portion of interconnect 38 after vias 60, 62 have been formed. As shown, upper feed through pads 52, 54 are formed having a recessed portion 64, 66 and lower feed through pads 56, 58 are sized to encompass vias 60, 62. According to one embodiment, lower feed through pads 56, 58 are wider than upper feed through pads 52, 54, as shown in FIGS. 8 and 9. However, one skilled in the art will recognize that the geometry of feed through pads 52-58 can be selected based on via placement and design specifications.

Figure 10:
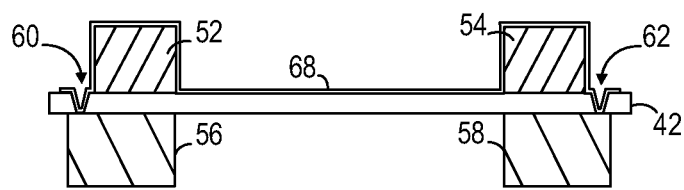
Figure 11:
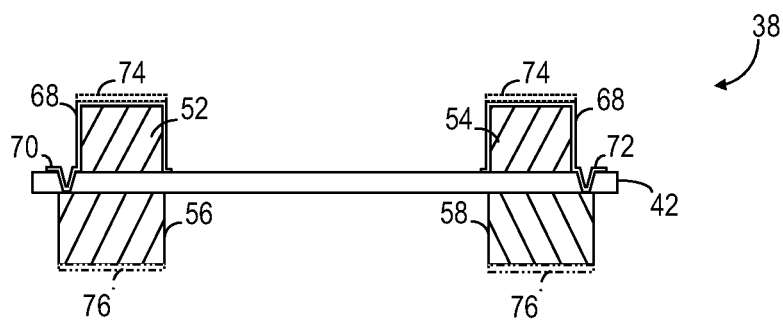

Referring now to FIG. 10, after vias 60, 62 are drilled and cleaned, a metallization layer 68 is applied to top surface 44 of film layer 42 such that it extends through vias 60, 62. Adhesion layer 68 may comprise an initial metallized seed layer of copper and titanium or chrome, for example, a layer of plated copper electroplated atop the seed layer, and a top layer of metal, such as titanium or chrome, for example, sputtered over the plated copper layer to act as an adhesion layer later in the fabrication process. Metallization layer 68 is then patterned and etched, as shown in FIG. 11. The resulting metalized vias 70, 72 form electrical connections between lower and upper pads 52-58. According to one embodiment, an optional additional metal 74 (shown in phantom), such as titanium or chrome, for example, may be formed atop metallization layer 68 to create an adhesion layer for later use during the assembly process.

Figure 12:
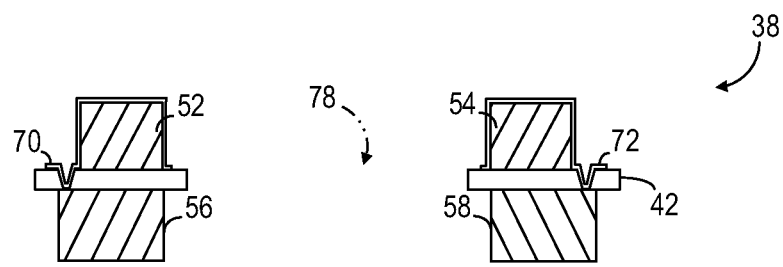

Optionally, an additional layer of metal 76 (shown in phantom), such as, for example, a nickel gold layer, may be applied to lower feed through pads 56, 58 using an electroless or electroplating technique based on design requirements. Referring to FIG. 12, depending on die thickness and design requirements, a portion of film layer 42 may optionally be removed with a laser to create an opening 78 therein that leaves clearance for die placement.

Referring now to FIGS. 13-17, a technique is set forth for fabricating an IC package 80 (FIG. 17) according to an embodiment of the invention. IC package 80 incorporates a feed through interconnect 82, such as interconnect 10 of FIG. 1 or interconnect 38 fabricated as described with respect to FIGS. 5-12 prior to assembly into IC package 80. Interconnect 82 comprises a number of upper feed through pads 84, 86 and lower feed through pads 88, 90 positioned on an insulating film layer 92. Metalized vias 94, 96 create an electrical connection between upper and lower feed through pads 84-90.

Figure 13:
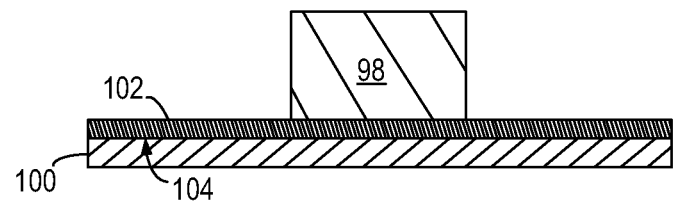
FIGS. 13-17 are schematic diagrams showing steps of making an IC package incorporating a feed through interconnect in accordance with an embodiment of the invention.
Figure 14:
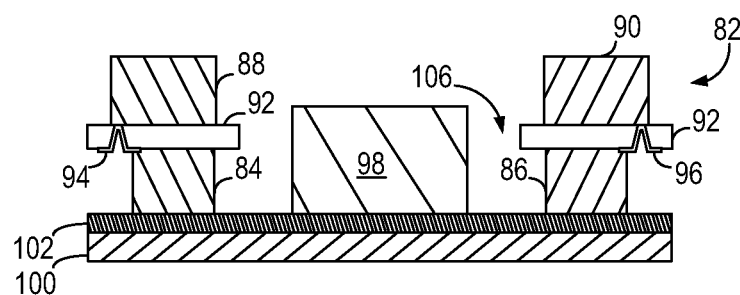

As shown in FIG. 13, fabrication of IC package 80 begins with positioning a die or semiconductor chip 98 on an insulating sheet 100, which may be stretched on a frame (not shown) during the fabrication process to control distortion. According to one embodiment, sheet 100 comprises a pre-patterned dielectric flex material such as, for example, Kapton film having a thickness of approximately 1-2 mil. A layer of epoxy adhesive 102 is applied to coat a top surface 104 of sheet 100. Epoxy adhesive 102 is then B-staged using a low temperature bake, which leaves epoxy adhesive 102 in a tacky state. Next, die 98 is positioned facedown into epoxy adhesive 102 using a pick and place system. After positioning die 98, interconnect 82 is placed into epoxy adhesive 102 and aligned around die 98 and the metallization pattern of flex layer 100. As shown in FIG. 14, interconnect 82 is aligned with die 98 such that die 98 extends through an opening 106 in film layer 92. Once die 98 and interconnect 82 are positioned, epoxy adhesive 102 is fully cured.

Figure 15:
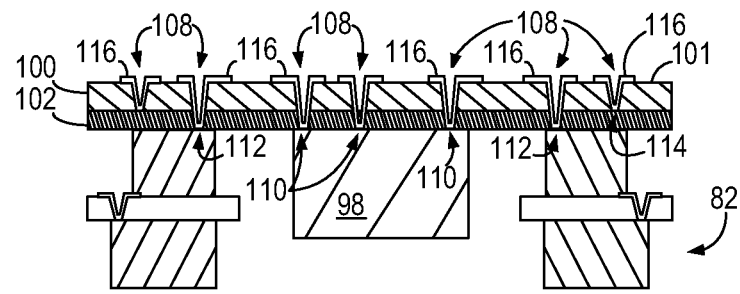
Figure 16:
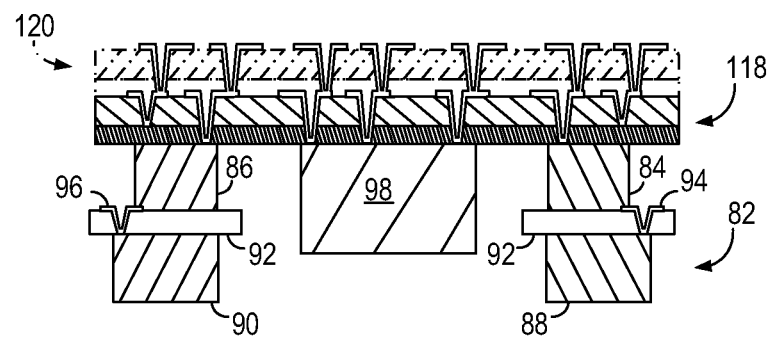

Referring now to FIG. 15, the fabrication technique continues with an embedded chip build up process. A plurality of vias 108 are formed through flex layer 100 to a number of contact surfaces 110 on die 98, a number of contact surfaces 112 on interconnect 82, and a number of contact surfaces 114 within flex layer 100. Vias 108 may be formed by UV laser drilling or dry etching, for example. After vias 108 are cleaned, metallization paths 116 are formed on top surface 101 of film 100. Metallization paths 116 extend through respective vias 108 and are electrically coupled to die 98 and upper feed through pads 84, 86 at respective contact surfaces 110, 112. In one embodiment, metallization paths 116 may comprise a layer of copper and may be formed using a sputtering and plating technique, followed by a lithography process. Together, flex layer 100, vias 108, and metallization paths 116 form a first redistribution layer 118. Optionally, an additional redistribution layer 120 may be laminated atop first redistribution layer 118. Although FIG. 16 illustrates two redistribution layers 118, 120, one skilled in the art will readily recognize the number and configuration of redistribution layers may be selected based on design specifications.

Figure 17:
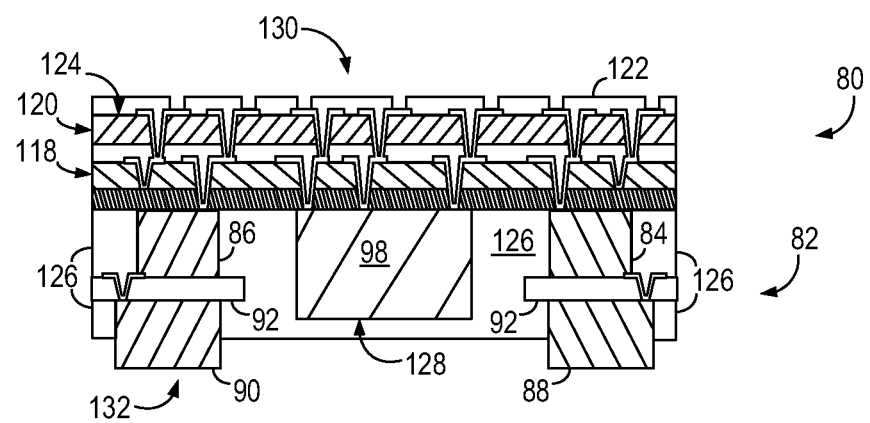

As shown in FIG. 17, the fabrication technique continues with the application of a soldermask layer 122 to coat a top surface 124 of redistribution layers 118, 120. An underfill material 126, such as an epoxy or other filler, for example, is also applied around die 98 and interconnect 82 to provide additional structural strength and isolation between pads 84-90. Alternatively, underfill 126 may be applied such that it does not cover a back surface 128 of die 98. Underfill 126 may be added earlier in the fabrication process after epoxy adhesive 102 has cured, according to alternative embodiments. The resulting IC package 80 has at least one input/output from die 98 on both a top side 130 and a bottom side 132 of IC package 80.

While FIGS. 13-17 are described with respect to a single IC package, one skilled in the art will recognize that the fabrication technique for an IC package is equally applicable to the simultaneous fabrication of a number of IC packages in a panelized form. In such an embodiment, multiple feed through interconnects are positioned around a number of dies on an insulating sheet. To reduce fabrication time, multiple interconnect modules, such as modules 36 (FIG. 4), may be used. Once fabrication is complete, the IC package panel can be laser singulated into individual IC packages.

Figure 18:
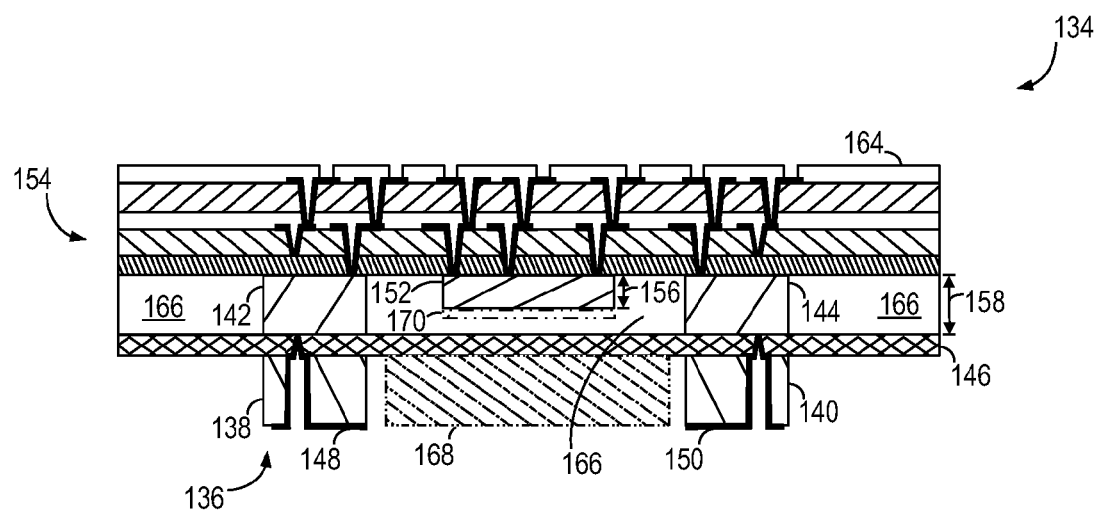
FIG. 18 is a diagram of a pre-fabricated interconnect integrated into an IC package assembly in accordance with an embodiment of the invention.

Referring to FIG. 18, an IC package 134 is shown, according to an alternative embodiment. IC package 134 includes a pre-fabricated interconnect assembly 136 comprising pairs of upper and lower feed through pads 138-144 mounted on a dielectric layer 146. Metalized vias 148, 150, which are formed in an alternative matter than that described with respect to FIGS. 7-11, extend though upper feed through pads 138, 140 and dielectric layer 146, creating an electrical connection with lower feed through pads 142, 144. Because metalized vias 148, 150 extend through upper feed through pads 138, 140, upper and lower feed through pads 138-144 may be formed having similar geometries. IC package 134 also includes a die 152 affixed to one or more first redistribution layers 154. Interconnect 136 is positioned around die 152. Because die 152 has a thickness 156 that is less than a thickness 158 of lower feed through pads 142, 144, dielectric layer 146 may be left intact, creating a buried die configuration as shown.

Figure 19:
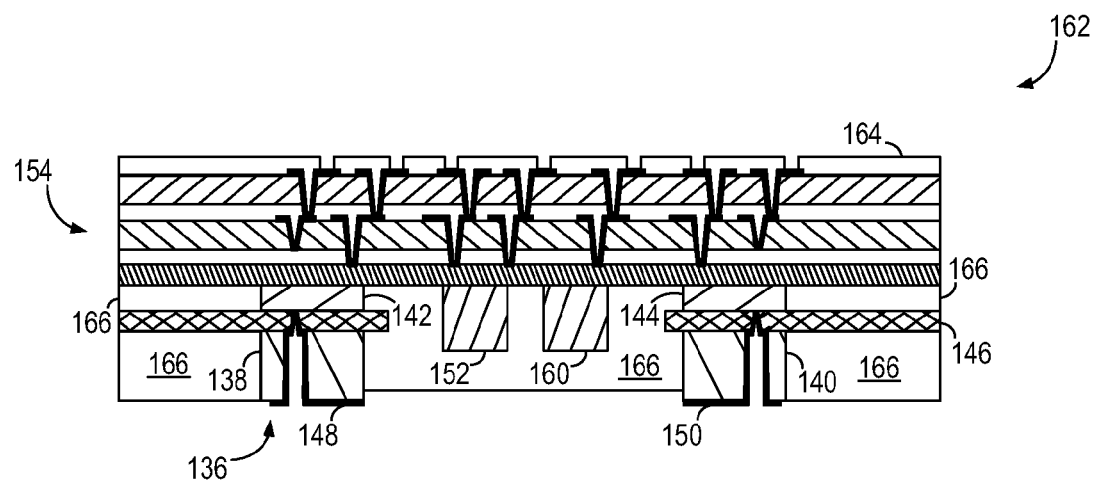
FIG. 19 is a diagram of a pre-fabricated interconnect integrated into an IC package assembly in accordance with another embodiment of the invention.

Alternatively, the thickness of interconnect 136 may be adjusted by reducing the thickness of feed through pads 138-144, as shown in FIG. 19. Further, a second die 160 may be mounted adjacent to die 152, according to an alternative embodiment, to form a multi-chip module 162. One skilled in the art will recognize that any number of additional dies may be included in multi-chip module 162.

Referring again to FIG. 18, IC package 134 also includes a soldermask 164, similar to that described with respect to FIG. 17. A layer of underfill 166 is applied around lower feed through pads 142, 144 and die 152. According to one embodiment, a heat sink 168 (shown in phantom) may optionally be affixed to dielectric layer 146. Alternatively, a heat sink 170 (shown in phantom) may be mated to die 152 for heat dissipation.

It is recognized that, according to embodiments of the invention, the dielectric or insulating film layer 18, 42, 92, 146 included in the interconnect assembly 10, 38, 82, 136 may vary in its construction and material composition. That is, while dielectric or insulating film layer 18, 42, 92, 146 has been described as a "layer" or "film" that is formed of a polyimide material, such as Kapton for example, it is recognized that other materials may be used and that the "layer" may in fact be in the form of a multi-layer structure. Accordingly, layer 18, 42, 92, 146 may instead be formed from a prepreg or printed circuit board core material composed of epoxy (that is fully cured) with glass fibers or other inclusions, for example, or may be formed from a ceramic material, composite dielectric material, or other similar/suitable insulating material—and thus the layer 18, 42, 92, 146 may be referred to as a "circuit layer."

It is also recognized that, according to embodiments of the invention, the insulating sheet/flex layer 100 included in the redistribution layers 118, 120, 154 of IC package 80, 134, 162 may vary in its construction and material composition. That is, while insulating sheet/flex layer 100 has been described as a Kapton film (having a thickness of approximately 1-2 mil), it is recognized that other materials may be used and that the "film" may in fact be in the form of a multi-layer structure. Accordingly, insulating sheet/flex layer 100 may instead be formed from a prepreg or printed circuit board core material composed of epoxy with glass fibers or other inclusions, for example, or may be formed from a ceramic material, composite dielectric material, or other similar/suitable insulating material.

Figure 20:
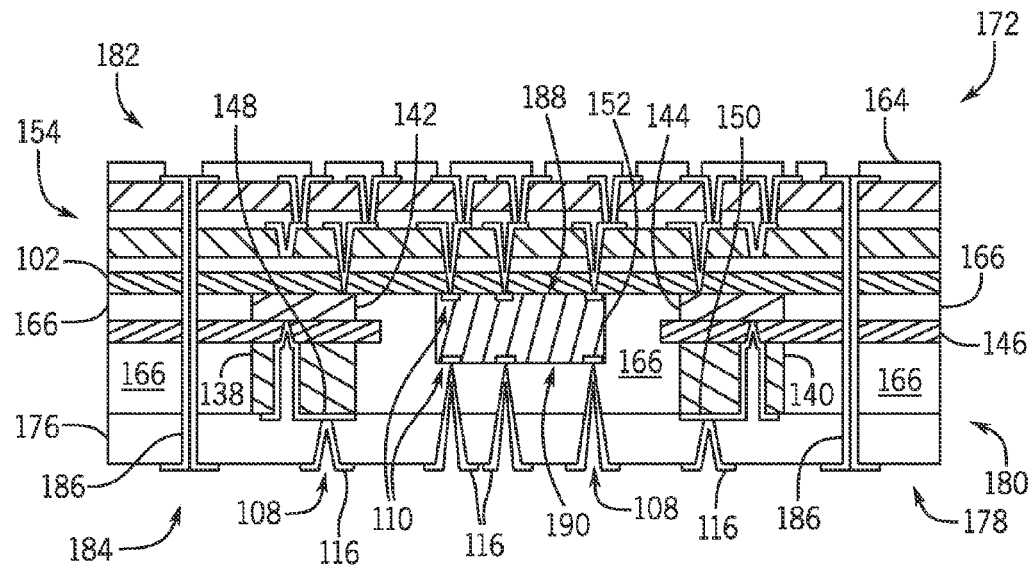
FIG. 20 is a diagram of a pre-fabricated interconnect integrated into an IC package assembly in accordance with another embodiment of the invention.
Figure 21:
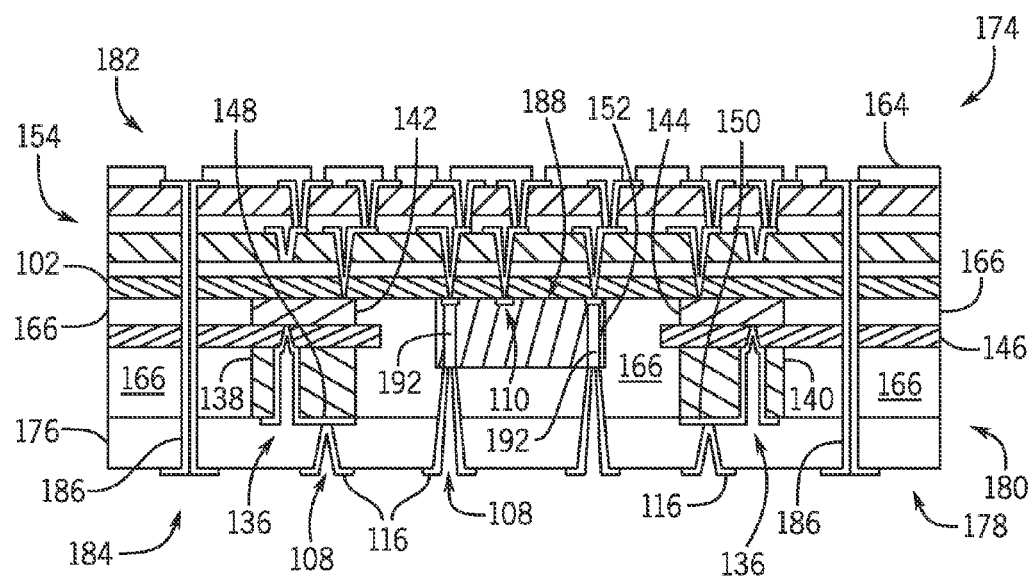
FIG. 21 is a diagram of a pre-fabricated interconnect integrated into an IC package assembly in accordance with another embodiment of the invention.

Referring now to FIGS. 20 and 21, additional IC packages 172, 174 are shown that include an additional substrate 176 (i.e., second substrate) that is positioned on a backside of the die 152 in the package, according to alternative embodiments. The substrate 176 may be in the form of a polyimide layer or film (e.g., Kapton), a prepreg or printed circuit board core material (composed of epoxy with glass fibers or other inclusions), a ceramic material, composite dielectric material, or other similar/suitable insulating material, and includes thereon metallization circuits or paths 116 that are formed on an outward facing surface 178 of the substrate 176 and extend down through respective vias 108 formed therein—thereby forming a redistribution layer 180. The substrate 176 serves to embed the die 152 within the IC package 172, 174, and the metallization circuits 116 formed thereon provide backside connections on the IC package 172, 174.

As shown in FIGS. 20 and 21, the IC packages 172, 174 are structured to enable electrical connection between front and back surfaces 182, 184 of the package. For providing such a connection, the metallization circuits 116 of redistribution layer 180 are electrically connected to metalized vias 148, 150 that extend though upper feed through pads 138, 140 and dielectric layer 146, which are in turn electrically connected with lower feed through pads 142, 144. That is, metallization paths 116 are formed that extend through respective vias 108 in the substrate 176 and are electrically coupled to metalized vias 148, 150 of the interconnect assembly 136, thereby electrically connecting redistribution layer 180 to redistribution layer(s) 154.

As another mechanism for enabling electrical connection between front and back surfaces 182, 184 of the package, the IC packages 172, 174 also include metalized thru-vias 186 formed through redistribution layers 154, adhesive 102, underfill 166, dielectric layer 146 and substrate 176 to redistribute electrical connections from the front surface 182 to the back surface 184. The metalized thru-vias 186 electrically couple the metallization paths 116 of redistribution layers 154 to the metallization circuits or paths 116 of redistribution layer 180 in order to provide electrical pathways through the IC package 172, 174.

According to an embodiment, and as shown in FIG. 20, the die 152 of IC package 172 is in the form of a two-sided power device having contact surfaces or pads 110 on both a front side 188 and a back side 190 thereof. Electrical connections 116 are therefore made to the contact surfaces 110 on back side 190 by forming vias 108 through substrate 176 and underfill 166 at locations corresponding to the contact surfaces 110 and forming metallization paths 116 down through the vias 108 to form an electrical connection with the back side contact surfaces 110 of the die 152.

According to another embodiment, and as shown in FIG. 21, the die 152 of IC package 174 is in the form of a one-sided device having contact surfaces or pads 110 only on the front side 188 thereof. In order to electrically connect the die 152 to the metallization paths 116 formed on the back side substrate 176 (i.e., to redistribution layer 180), thru-silicon vias 192 are formed through the die 152. The die 152 can therefore be directly connected to the back surface 184 of the IC package 174 by forming vias 108 through substrate 176 and underfill 166 at locations corresponding to the thru-silicon vias 192 and forming metallization paths 116 down through the vias 108 to form an electrical connection with the thru-silicon vias 192 of the die 152.

While the IC packages 172, 174 of FIGS. 20 and 21 are shown as including only a single redistribution layer 180 on the back side of the package, it is recognized that one or more additional redistribution layers (not shown) may be laminated atop redistribution layer 180. One skilled in the art will readily recognize the number and configuration of redistribution layers 180 may be selected based on design specifications. Additionally, it is recognized that input/output (I/O) connections, e.g., ball grid array (BGA), or one or more components, e.g., passive devices, etc., (not shown) could be formed on or affixed to an outermost redistribution layer 180, as selected based on design specifications of the IC package 172, 174.

Figure 22:
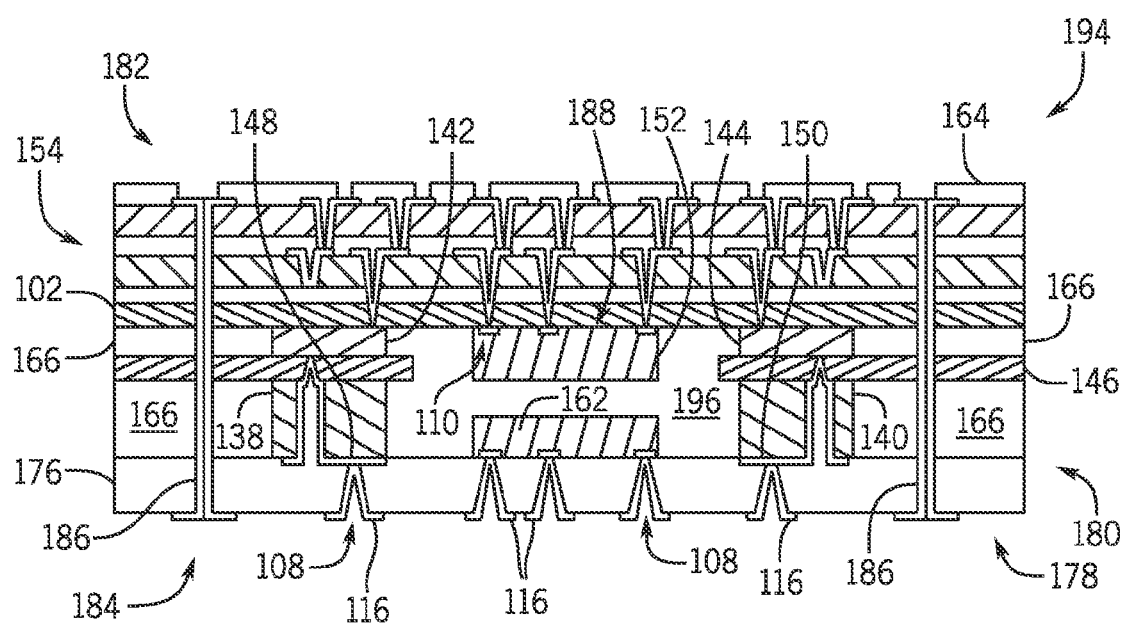
FIG. 22 is a diagram of a pre-fabricated interconnect integrated into an IC package assembly in accordance with another embodiment of the invention.

While only a single die 152 is shown included in IC packages 172, 174, it is recognized that one or more additional dies could be included therein. In one embodiment, two dies are arranged in a side-by-side manner similar to the arrangement of dies 152, 162 in the IC package 162 of FIG. 19. In another embodiment, and as shown in FIG. 22, an IC package 194 is provided where dies 152, 162 are arranged so as to be aligned in a stacked arrangement—i.e., the dies 152, 162 are positioned on top of one another. In such an arrangement, the first die 152 is attached to the redistribution layer layer(s) 154 (i.e., to substrate 100), while the second die 162 is attached to the redistribution layer 180 (i.e., to substrate 176). The dies 152, 162 are thus electrically connected to redistribution layers 154, 180, respectively, with the redistribution layers 154, 180 being connected to one another via the interconnect assembly 136. According to embodiments, the two dies 152, 162 could be positioned so as to be touching each other or separate from one another (as shown in FIG. 22) by a filler material 196 provided around/between the dies 152, 162—with the filler material 196 being either an electrically isolating material or an electrically conducting material.

Accordingly, embodiments of the invention include an interconnect assembly that may be incorporated into an IC package to allow for input/output from a die to be brought out on both the top and bottom sides of the interconnect assembly. Embodiments of the interconnect assembly may be used with very thin die (e.g., 50 μm or less) and achieve similar electrical connections as conventional integrated chip packages with a reduced number of interlayer patterning and metallization steps.

Additionally, embodiments of the interconnect assembly described herein may be pre-fabricated in various thicknesses to accommodate various die dimensions and device structures such as buried die and stacked die configurations. By pre-fabricating the interconnect assembly, the interconnect may be tested prior to being incorporated into an IC package, improving the yield of the final assembled IC package.

Further, an IC package assembled using the above-described method and pre-fabricated interconnect assembly remains flatter after assembly than an IC package fabricated using conventional methods. Due to the interconnect assembly's structural design and pre-fabricated nature, use of the interconnect assembly in an IC package results in less stresses and planar warpage in the assembled IC package. Thus, the die and mounting substrate of an IC package assembled using a pre-fabricated interconnect assembly remains relatively flat (i.e., deviates from being planar by less than approximately 5%) in the plane parallel to the mounting surface of the die.

Therefore, according to one embodiment of the invention, a chip package includes a first substrate having at least one circuit layer formed on a first surface thereof, a first die mounted on a second surface of the first substrate opposite from the first surface, an interconnection assembly comprising upper and lower conductive layers provided on an insulating substrate, with the upper conductive layer of the interconnection assembly being affixed to the second surface of the first substrate and electrically connected to the at least one circuit layer of the first substrate, and a second substrate positioned on a side of the first die opposite from the first substrate so as to position the die between the first and second substrates, the second substrate having at least one circuit layer formed on an outward facing first surface thereof that is electrically connected to at least one of the lower conductive layers of the interconnection assembly and the first die.

According to another embodiment of the invention, an embedded chip package includes an interconnection assembly having an upper conductive layer, a lower conductive layer, and an insulating substrate positioned between the upper and lower conductive layers, the upper and lower conductive layers being electrically connected via metalized connections therebetween. The embedded chip package also includes a first substrate attached to the upper conductive layer and having at least one circuit layer formed thereon that is electrically connected to the upper conductive layer, a second substrate attached to the lower conductive layer and having at least one circuit layer formed thereon that is electrically connected to the lower conductive layer, and a first die mounted on the first substrate so as to be positioned between the first and second substrates and within an opening defined by the interconnection assembly.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A chip package comprising:
a first substrate having at least one circuit layer formed on a first surface thereof;
a first die mounted on a second surface of the first substrate, opposite from the first surface;
an interconnection assembly comprising upper and lower conductive layers provided on an insulating substrate, with the upper conductive layer of the interconnection assembly being affixed to the second surface of the first substrate and electrically connected to the at least one circuit layer of the first substrate; and
a second substrate positioned on a side of the first die opposite from the first substrate so as to position the first die between the first and second substrates, the second substrate having at least one circuit layer formed on an outward facing first surface thereof that is electrically connected to at least one of the lower conductive layers of the interconnection assembly and the first die.

2. The chip package of claim 1 wherein each of the first substrate, the second substrate, and the insulating substrate is formed of one of a polyimide material, ceramic material, composite dielectric material, prepreg or printed circuit board core material.

3. The chip package of claim 1 further comprising thru-vias that extend through the chip package from the first substrate to the second substrate, the thru-vias electrically coupling the at least one circuit layer of the first substrate to the at least one circuit layer of the second substrate.

4. The chip package of claim 1 wherein the first die comprises a contact surface formed on a front side of the first die or on the front side and a back side of the first die.

5. The chip package of claim 4 wherein the first die comprises a power device having contact surfaces formed on the front side and the back side, with the at least one circuit layer of the first substrate being electrically coupled to the contact surface on the front side of the first die and the at least one circuit layer of the second substrate being electrically coupled to the contact surface on the back side of the first die.

6. The chip package of claim 1 wherein the first die includes thru-silicon vias that extend through the first die from the front side to the back side thereof, with the at least one circuit layer of the second substrate being mechanically and electrically coupled to the thru-silicon vias of the first die.

7. The chip package of claim 1 wherein the upper and lower conductive layers are electrically connected via metalized connections therebetween.

8. The chip package of claim 1 wherein the upper conductive layer comprises a plurality of upper copper pads; and
wherein the lower conductive layer comprises a plurality of lower copper pads.

9. The chip package of claim 1 wherein an upper surface of the upper conductive layer is affixed to the second surface of the first substrate; and
wherein a plurality of metalized vias are formed between an upper surface of the lower conductive layer and a lower surface of the upper conductive layer, opposite the upper surface.

10. The chip package of claim 1 wherein the interconnection assembly has a die opening formed therein; and
wherein the interconnection assembly is aligned with the first die such that the first die extends through the die opening.

11. The chip package of claim 10 wherein the first die is embedded within an isolating material in the die opening.

12. The chip package of claim 1 wherein the at least one circuit layer comprises at least one metalized flex layer having a plurality of metalized vias formed therethrough.

13. The chip package of claim 1 further comprising a second die mounted adjacent to the first die on the second surface of the first substrate.

14. The chip package of claim 1 further comprising a second die vertically aligned with the first die, with the first die being attached to the second surface of the first substrate and the second die being attached to an inward facing second surface of the second substrate;
wherein the first and second dies are positioned so as to contact each other or be separated from one another by an electrically isolating or electrically conductive filler material, with the first and second dies being electrically connected via the interconnection assembly.

15. An embedded chip package comprising:
an interconnection assembly comprising:
an upper conductive layer;
a lower conductive layer; and
an insulating substrate positioned between the upper and lower conductive layers, the upper and lower conductive layers being electrically connected via metalized connections therebetween;
a first substrate attached to the upper conductive layer and having at least one circuit layer formed thereon that is electrically connected to the upper conductive layer;
a second substrate attached to the lower conductive layer and having at least one circuit layer formed thereon that is electrically connected to the lower conductive layer; and a first die mounted on the first substrate so as to be positioned between the first and second substrates and within an opening defined by the interconnection assembly.

16. The embedded chip package of claim 15 further comprising thru-vias that extend through the chip package from the first substrate to the second substrate, the thru-vias electrically coupling the at least one circuit layer of the first substrate to the at least one circuit layer of the second substrate.

17. The embedded chip package of claim 16 wherein the first die comprises a contact surface formed on a front side of the first die or on the front side and a back side of the first die.

18. The embedded chip package of claim 17 wherein the first die comprises a power device having contact surfaces formed on the front side and the back side, with the at least one circuit layer of the first substrate being electrically coupled to the contact surface on the front side of the first die and the at least one circuit layer of the second substrate being electrically coupled to the contact surface on the back side of the first die.

19. The embedded chip package of claim 17 wherein the first die includes thru-silicon vias that extend through the first die from the front side to the back side thereof, with the at least one circuit layer of the second substrate being mechanically and electrically coupled to the thru-silicon vias of the first die.

20. The embedded chip package of claim 16 wherein the upper conductive layer comprises a plurality of upper copper pads and the lower conductive layer comprises a plurality of lower copper pads.

* * * * *